United States Patent
Tajima et al.

(10) Patent No.: US 8,859,415 B2
(45) Date of Patent: Oct. 14, 2014

(54) METHOD OF FORMING WIRING OF A SEMICONDUCTOR DEVICE

(75) Inventors: Takayuki Tajima, Kanagawa-ken (JP); Akira Tojo, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 274 days.

(21) Appl. No.: 13/414,454

(22) Filed: Mar. 7, 2012

(65) Prior Publication Data

US 2012/0231625 A1     Sep. 13, 2012

(30) Foreign Application Priority Data

Mar. 8, 2011   (JP) .............................. P2011-050841

(51) Int. Cl.
*H01L 21/4763*  (2006.01)
*H01L 21/768*   (2006.01)
*H01L 23/532*   (2006.01)

(52) U.S. Cl.
CPC .... H01L 23/53238 (2013.01); H01L 21/76802 (2013.01); H01L 21/7684 (2013.01)
USPC ........... 438/618; 438/622; 438/624; 438/652; 438/660; 257/758; 257/760; 257/E21.586

(58) Field of Classification Search
None
See application file for complete search history.

(56) References Cited

U.S. PATENT DOCUMENTS

| | | | |
|---|---|---|---|
| 7,183,196 B2 * | 2/2007 | Muramatsu et al. ......... | 438/622 |
| 7,279,357 B2 * | 10/2007 | Shimoishizaka et al. ..... | 438/107 |
| 7,642,647 B2 * | 1/2010 | Minda .......................... | 257/738 |
| 8,211,793 B2 | 7/2012 | Lee et al. | |
| 8,436,252 B2 * | 5/2013 | Kawano et al. .............. | 174/257 |
| 2002/0017453 A1 * | 2/2002 | Iguchi ....................... | 204/192.17 |

FOREIGN PATENT DOCUMENTS

| | | |
|---|---|---|
| JP | 10-144790 | 5/1998 |
| JP | 2000-174015 | 6/2000 |
| JP | 3632981 | 1/2005 |
| JP | 2006-41357 | 2/2006 |
| JP | 2008-270600 | 11/2008 |
| KR | 10-0782485 | 12/2007 |

OTHER PUBLICATIONS

Notification of the First Office Action issued by the State Intellectual Property Office of the People's Republic of China on Dec. 4, 2013, for Chinese Patent Application No. 201210060302.9, and English-language translation thereof.

Notice of Grounds for Rejection issued by the Korean Intellectual Property Office on Feb. 8, 2013, for Korean Patent Application No. 10-2012-23367, and English-language translation thereof.

* cited by examiner

*Primary Examiner* — Zandra Smith
*Assistant Examiner* — Khanh Duong
(74) *Attorney, Agent, or Firm* — Finnegan, Henderson, Farabow, Garrett & Dunner, L.L.P.

(57) ABSTRACT

A method of forming wiring of a semiconductor device includes: forming an insulating resin on a main surface of a substrate such that an opening portion defining a wiring pattern is provided in the insulating resin; forming a first wiring layer made of a first metal on a bottom surface and side surfaces of the opening portion surrounding and a surface of the insulating resin opposite to the main surface of the substrate, the first wiring layer having a bottom portion formed on the bottom surface of the opening portion and side portions formed on the side surfaces, the bottom portion having a thickness greater than a thickness of at least one of the side portions; and cutting the insulating resin and the first wiring layer such that the insulating resin and the first wiring layer are exposed.

10 Claims, 3 Drawing Sheets

METHOD OF FORMING WIRING OF A SEMICONDUCTOR DEVICE

CROSS-REFERENCE TO RELATED APPLICATIONS

This application is based upon and claims the benefit of priority from Japanese Patent Application No. 2011-050841, filed on Mar. 8, 2011; the entire contents of which are incorporated herein by reference.

FIELD

This embodiment relates to a method of forming wiring of a semiconductor device. In particular, the invention relates to a method for forming buried wiring of a semiconductor.

BACKGROUND

To form wiring of a semiconductor device, typically, an insulating layer is provided on a substrate. The insulating layer has a concave portion formed therein for providing first and second wiring layers. Then first and second wiring layers are sequentially formed. Each of the first and second wiring layers has a uniform thickness. Then the surfaces of the insulating layer, the first wiring layer, and the second wiring layer are flattened by using a cutting tool.

Wiring of the semiconductor is delaminated by an external force such as an ultrasonic wave from an electronic component and a wire. Therefore, the first wiring layer is often made of Ti, which has high adhesibility with the substrate and the insulating layer. And the second wiring layer is made of Cu or Al, which is a highly conductive metal. However, Ti is a difficult-to-cut material, and its machinability is poor. As a result, the life of a cutting tool becomes short.

DETAILED DESCRIPTION

Reference will now be made in detail to the present embodiment of the invention, an example of which is illustrated in the accompanying drawings. Wherever possible, the same reference numbers will be used throughout the drawings to refer to the same or like parts.

According to one embodiment, a method of forming wiring of a semiconductor device includes forming an insulating resin on a main surface of a substrate such that an opening portion defining a wiring pattern is provided in the insulating resin, the opening portion exposing the main surface of the substrate and having a bottom surface and side surfaces surrounding the bottom surface; forming a first wiring layer made of a first metal on the bottom surface and side surfaces of the opening portion surrounding and a surface of the insulating resin opposite to the main surface of the substrate, the first wiring layer having a bottom portion formed on the bottom surface of the opening portion and side portions formed on the side surfaces, the bottom portion having a thickness greater than a thickness of at least one of the side portions; and cutting the insulating resin and the first wiring layer such that the insulating resin and the first wiring layer are exposed.

Figure 1A:
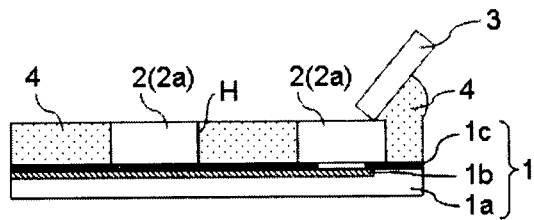
FIGS. 1A to 1E are cross-sectional views showing steps of a method of forming wiring of a semiconductor device according to one embodiment.
Figure 1B:
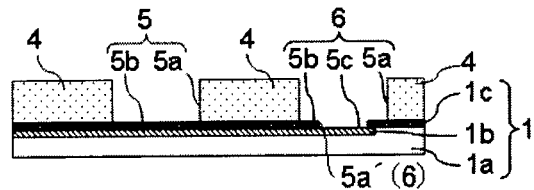

As shown in FIG. 1A, a substrate 1 is provided, and a mask 2 is provided on the substrate 1. The mask 2 has holes H defining a pattern of insulating layers, which corresponds to a reverse pattern to a pattern of wiring layers. Then, an insulating resin 4 is applied by screen printing using a squeegee 3. Next, as shown in FIG. 1B, the mask 2 applied on the substrate 1 is removed.

In this embodiment, the substrate 1 may be a wafer in which semiconductor elements are formed. The substrate 1 includes a silicon substrate 1a, an inner-layer wiring 1b formed on the silicon substrate 1a, and an insulating layer is formed on the inner-layer wiring 1b. The inner-layer wiring 1b is formed of a metal having a high electrical conductivity, such as Cu. The insulating layer 1c is provided in such a manner that a part of the inner-layer wiring 1b may be exposed. The insulating layer 1c and the exposed inner-layer wiring 1b may correspond to a main surface of the substrate in the embodiment shown in FIG. 1A.

Although the embodiment uses a wafer having semiconductor elements formed therein, the invention is not limited to such wafers. Moreover, although the inner-layer wiring 1b of the wafer in the embodiment is exposed, a wafer from which the inner-layer wiring 1b is not exposed may be used instead.

Figure 3:
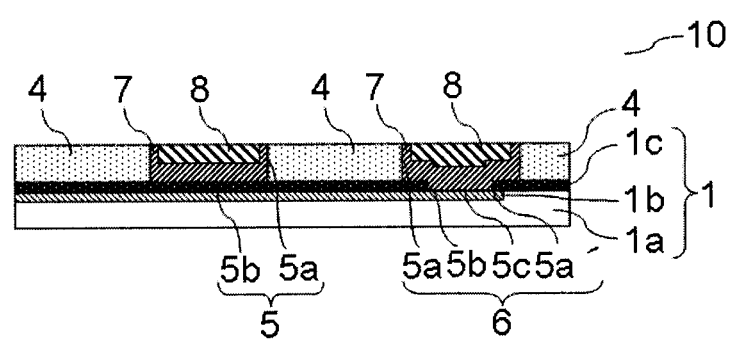
FIG. 3 is a cross-sectional view showing a semiconductor device according to the embodiment.

The mask 2 is formed of a wire member (not shown) and solid materials 2a surrounding the wire member inside a metal frame (not shown). The wire member and the solid materials are laid along the pattern of the wiring desired to be formed. In addition, the holes H are formed between the solid materials 2a. Note that although the embodiment uses the mask 2 including the wiring member and the solid materials 2a formed inside the metal frame, other masks that are known to one skilled in the art can be used. For example, any type of a mask may be used for the mask 2 as long as the insulating resin 4 can be provided to surround the positions where the first and second wiring layers 7 and 8 shown in FIG. 3, which will be described later, are to be formed.

As the material of the wire member, a resin such as nylon, polyester, or the like, or a metal such as stainless steel is used, for example. However, the material of the wire member is not limited to these materials, and may be any material as long as the solid materials 2a can be supported by the wire member. In addition, the material of the solid materials 2a is one formed of a photosensitive resin or a metal such as electrolytic nickel or the like.

The insulating resin 4 has a first opening portion 5 formed therein such that a part of the insulating layer 1c of the substrate 1 is exposed, as shown in FIG. 1B. In addition, the insulating resin 4 has a second opening portion 6 formed therein such that a part of the inner-layer wiring 1b and a part of the insulating layer 1c of the substrate 1 are exposed. The insulating resin has a surface opposite to the main surface of the substrate 1.

The first opening portion 5 has a first bottom surface 5b and a side surface 5a. The first bottom surface 5b corresponds to an exposed portion of the main surface of the substrate, where the insulating layer 1c of the substrate 1 is exposed. The side surface 5a is a surface surrounding the first bottom surface 5b. On the other hand, the second opening portion 6 is formed by a second bottom surface 5c, a side surface 5a', a first bottom surface 5b, and a side surface 5a. The second bottom surface 5c is a region at which the inner-layer wiring 1b of the substrate 1 is exposed. The side surface 5a' is exposed while surrounding the second bottom surface 5c. The side surface 5*a* is a surface surrounding the first bottom surface 5*b*. As the material of the insulating resin 4, heat-resistant epoxy resin is used. However, the material of the insulating resin 4 is not limited to epoxy resin, and may be any material as long as the material is a heat-resistant resin.

Note that although the insulating resin 4 is formed by screen printing in the embodiment, the method of forming the insulating resin 4 is not limited to screen printing. The insulating resin 4 may be formed for example by relief printing, intaglio printing, ink-jet printing, nanoimprint lithography or the like.

Figure 1C:
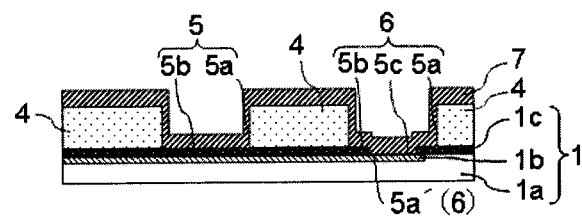

Next, as shown in FIG. 1C, a first wiring layer 7 is provided on the insulating resin 4 and the first and second opening portions 5 and 6. In this example, the first wiring layer is formed of Ti, and the first wiring layer 7 may be formed by a dry process such as sputtering or vacuum deposition. The first wiring layer 7 is made of a difficult-to-cut material, such as Ti, and it has thermal conductivity equal to or lower than Ti. The first wiring has a bottom portion and side portions. The bottom portion is formed on the bottom surface of the opening portion, and the side portions are formed on the side surfaces of the opening portion. The bottom portion has a thickness greater than a thickness of at least one of the side portions. For example, the side portion of the first wiring layer 7 has a thickness of approximately 20 nm to approximately 50 nm on the side surfaces 5*a* and 5*a*' of the first and second opening portions 5 and 6, and to have a thickness of approximately 200 nm to approximately 300 nm on the first and second bottom surfaces 5*b* and 5*c* of the first and second opening portions 5 and 6. In this process, the film deposition is performed with the control on the distribution of incident angles at which Ti particles are incident on the first and second opening portions 5 and 6 of the substrate 1 from a target (not shown) from which ionized Ti particles are emitted. The control on the distribution of incident angles is performed by adjusting, as parameters, a magnetic field distribution and a bias voltage between the target and the first and second opening portions 5 and 6 of the substrate 1. Moreover, the distribution of incident angles is controlled and adjusting by altering the magnetic arrangement and strength of the magnet field.

The reasons why the thickness of the first wiring layer 7 formed on the side surfaces 5*a* and 5*a*' is set at approximately 20 nm to approximately 50 nm will be described. In particular, when the first wiring layer 7 formed on the side surface 5*a* is thinner than approximately 20 nm, adhesion of the first wiring layer 7 to the insulating resin 4 is decreased. Accordingly, when an external force or the like, such as an ultrasonic wave, is applied at the time of providing an electronic component, wires, and the like, the insulating resin 4 and the first wiring layer 7 are separated from each other. On the other hand, when the first wiring layer 7 is thicker than approximately 50 nm, the poor machinability of Ti shortens the service life of a cutting tool 9 used in the step of flattering, which will be described later. For these reasons, the first wiring layer 7 formed on the side surfaces 5*a* and 5*a*' is provided to have a thickness of approximately 20 nm to approximately 50 nm. This makes it possible to secure the adhesion, to improve the machinability by reducing an amount of the first wiring layer 7 to be cut by using a cutting tool 9, and to thus achieve a longer service life of the cutting tool 9.

The reasons why the thickness of the first wiring layer 7 formed on the first and second bottom surfaces 5*b* and 5*c* is set at approximately 200 nm to approximately 300 nm will be described. When the first wiring layer 7 formed on the first and second bottom surfaces 5*b* and 5*c* is thinner than approximately 200 nm, adhesion of the first wiring layer 7 to each of the first and second bottom surfaces 5*b* and 5*c* of the first and second opening portions 5 and 6 is decreased. In particular, since an external force or the like such as an ultrasonic wave imposes more load on the first and second bottom surfaces 5*b* and 5*c* than on the side surfaces 5*a* and 5*a*', such a thin thickness makes the first wiring layer 7 more likely to be separated from the first and second bottom surfaces 5*b* and 5*c*.

On the other hand, when the first wiring layer 7 formed on the first and second bottom surfaces 5*b* and 5*c* is thicker than approximately 300 nm, the electrical resistance of the material Ti, which is larger than those of low electrical resistance materials such as Cu, impedes the flow of electricity in the first wiring layer 7. In particular, when the first wiring layer 7 is provided to be in contact with the inner-layer wiring 1*b* in the second opening portion 6, such a thickness makes it difficult for the electricity from the inner-layer wiring 1*b* to flow through the first wiring layer 7. Moreover, the first wiring layer 7 is formed simultaneously on the side surfaces 5*a* and 5*a*' as well as the first and second bottom surfaces 5*b* and 5*c* of the first and second opening portions 5 and 6 by application of a voltage, a magnetic field, or an electric field. Accordingly, when the first wiring layer 7 is formed to be thicker than approximately 300 nm on the first and second bottom surfaces 5*b* and 5*c*, the thickness of the first wiring layer 7 formed particularly on the side surface 5*a* becomes greater than approximately 50 nm.

Therefore, providing the first wiring layer 7 to be formed on the first and second bottom surfaces 5*b* and 5*c* with a thickness of approximately 200 nm to approximately 300 nm makes it possible to ensure the adhesion and reduce the electrical resistance.

Figure 1D:
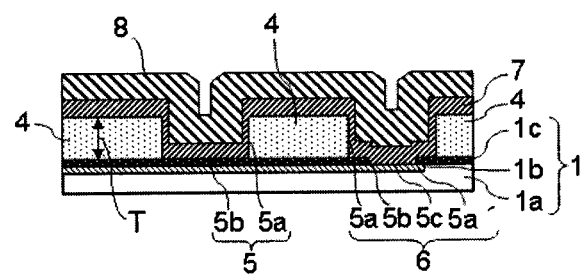

Next, as shown in FIG. 1D, a second wiring layer 8 formed of Cu for example is provided on the first wiring layer 7. Note that although the second wiring layer 8 is formed of Cu in the embodiment, the present invention is not limited thereto. For example, any metal such as Al may be used as long as the metal has a low electrical resistance. In addition, although the second wiring layer 8 is provided by sputtering in the embodiment, the present invention is not limited thereto. For example, any method such as electroplating or a combination of sputtering and electroplating may be employed as long as the method is capable of providing a low electrical resistance material.

In addition, the second wiring layer 8 is provided such that the height of the second wiring layer 8 is substantially the same as or slightly greater than the height T of the side surfaces 5*a* of the first and second opening portions 5 and 6. This makes it possible to securely fill the first and second opening portions 5 and 6 with the second wiring layer 8.

Figure 1E:
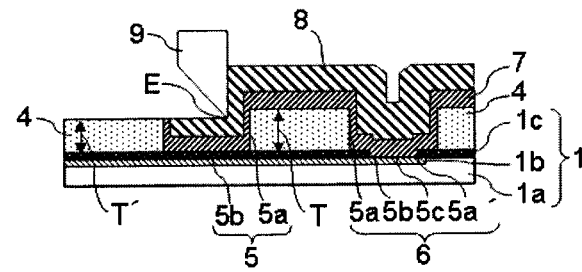
Figure 2:
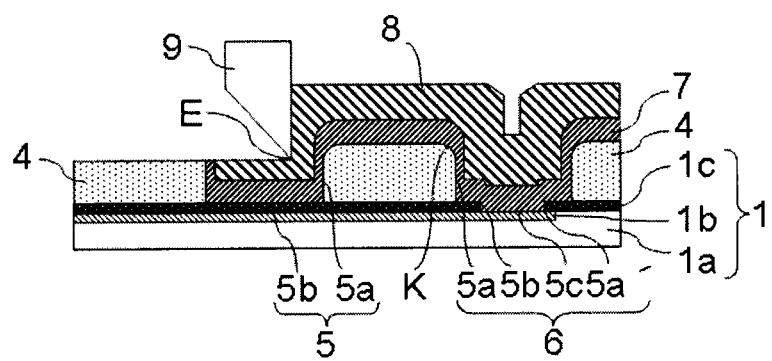
FIG. 2 is a cross-sectional view showing the method of forming wiring of a semiconductor device according to the embodiment.

Next, as shown in FIG. 1E, cutting is performed by using the cutting tool 9 such that the insulating resin 4, the first wiring layer 7, and the second wiring layer 8 are exposed, and flattening is performed such that the insulating resin 4 as well as the first and second opening portions 5 and 6 after the cutting have a substantially equal height T'. In this embodiment, the height is measured from the main surface of the substrate. In this process, it is preferable that the insulating resin 4 is cut to a height slightly lower than the height T of the side surface 5*a* of the first and second opening portions 5 and 6. The cutting in such a manner does not cause a portion of the first wiring layer 7 that is formed on the insulating resin 4 to be cut with an edge E of the cutting tool 9, and thus makes it possible to increase the service life of the cutting tool 9 as compared with the conventional case.

Moreover, in some cases, the mask 2 is removed together with some of the insulating resin 4 attached thereto when the insulating resin 4 is provided. For example, as shown in FIG.

2, the cross-sectional shape of corner portions K of the insulating resin 4 on the opposite surface side of each of the first and second bottom surfaces 5b and 5c is sometimes formed to be wider than the width of the bottom surface 5b. In this case, the thickness of the first wiring layer 7 on the lateral sides of the corner portions K is formed to be slightly greater than the thickness of the first wiring layer 7 formed on the side surface 5a. For this reason, in the cutting using the cutting tool 9, if the cutting is performed to a portion of a height equal to or greater than the height T of the side surfaces 5a of the first and second opening portions 5 and 6, the amount of the first wiring layer 7 to be cut by the edge E of the cutting tool 9 is increased. However, cutting to the portion of a height which is measured from the main surface of the substrate slightly lower than the height T of the side surfaces 5a of the first and second opening portions 5 and 6 as in the embodiment reduces the cut amount of the first wiring layer 7, thus making it possible to increase the service life of the cutting tool 9.

A semiconductor device 10 of the embodiment formed as described above includes: a substrate 1; an insulating resin 4; a first wiring layer 7; and a second wiring layer 8. The insulating resin 4 is provided such that the first and second opening portions 5 and 6 are formed in the insulating resin 4 to expose an inner-layer wiring 1b and an insulating layer 1c, which are part of the substrate 1. The first wiring layer 7 is formed on first and second bottom surfaces 5b and 5c and on side surfaces 5a and 5a' of the first and second opening portions 5 and 6. The first and second bottom surfaces 5b and 5c are regions which are surrounded by the insulating resin 4 and from which part of the substrate 1 is exposed. The side surfaces 5a and 5a' surround the first and second bottom surfaces 5b and 5c of the first and second opening portions 5 and 6 and are formed of the insulating resin 4. The first wiring layer 7 is provided also such that the thickness of the first wiring layer 7 formed on the first and second bottom surfaces 5b and 5c is greater than the thickness of the first wiring layer 7 formed on the side surfaces 5a and 5a'. The second wiring layer 8 is formed on the first wiring layer 7 and provided such that the first and second opening portions 5 and 6 are filled with the second wiring layer 8.

Furthermore, the first wiring layer 7 is formed to have a thickness of approximately 20 nm to approximately 50 nm on the side surfaces 5a and 5a' and to have a thickness of approximately 200 nm to approximately 300 nm on the first and second bottom surfaces 5b and 5c.

According to the method of forming wiring of a semiconductor device of the above-described embodiment, the wiring is formed such that the thickness of the first wiring layer 7 formed on the first and second bottom surfaces 5b and 5c of the first and second opening portions 5 and 6 is greater than the thickness of the first wiring layer 7 formed on the side surfaces 5a, which are formed of the insulating resin 4, of the first and second opening portions 5 and 6.

This makes it possible to secure the adhesion to the insulating resin 4 forming the side surfaces 5a and 5a' and the adhesion to the first and second bottom surfaces 5b and 5c of the first and second opening portions 5 and 6, to improve the machinability by reducing the amount of the first wiring layer 7 to be cut by the cutting tool 9, and thus to increases the service life of the cutting tool 9.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method of forming wiring of a semiconductor device, comprising:

forming an insulating resin on a main surface of a substrate such that an opening portion defining a wiring pattern is provided in the insulating resin, the opening portion exposing the main surface of the substrate and having a bottom surface and side surfaces surrounding the bottom surface;

forming a first wiring layer made of a first metal on the bottom surface and side surfaces of the opening portion surrounding a surface of the insulating resin opposite to the main surface of the substrate, the first wiring layer having a bottom portion formed on the bottom surface of the opening portion and side portions formed on the side surfaces, the bottom portion having a thickness greater than a thickness of at least one of the side portions; and cutting the insulating resin and the first wiring layer such that the insulating resin and the first wiring layer are exposed, wherein the thickness of the at least one of the side portions of the first wiring layer ranges approximately 20 nm-50 nm, and the thickness of the bottom portion of the first wiring layer ranges approximately 200 nm-300 nm.

2. The method of forming wiring of a semiconductor device according to claim 1, further comprising forming a second wiring layer made of a second metal on the first wiring layer, the first metal being harder than the second metal.

3. The method of forming wiring of a semiconductor device according to claim 2, wherein the insulating resin, the first wiring layer, and the second wiring layer are cut to an equal height which is measured from the main surface of the substrate opposite to the main surface of the substrate.

4. The method of forming wiring of a semiconductor device according to claim 2, wherein the first metal is Ti and the second metal is Cu or Al.

5. The method of forming wiring of a semiconductor device according to claim 1, wherein the insulating resin is cut at a height which is measured from the main surface of the substrate to opposite to the main surface of the substrate lower than a height of the at least one of the side portions of the first wiring layer.

6. The method of forming wiring of a semiconductor device according to claim 1, wherein the first metal is a difficult-to-cut material.

7. The method of forming wiring of a semiconductor device according to claim 6, wherein the difficult-to-cut material is Ti.

8. The method of forming wiring of a semiconductor device according to claim 1, wherein the first metal is applied by film deposition to form the first wiring layer.

9. The method of forming wiring of a semiconductor device according to claim 8, wherein the thicknesses of the bottom portion and the side portions are adjusted by controlling distribution of incident angles of the first metal.

10. A method of forming wiring of a semiconductor device, comprising:

forming an insulating resin on a main surface of a substrate such that an opening portion defining a wiring pattern is provided in the insulating resin, the opening portion exposing the main surface of the substrate and having a bottom surface and side surfaces surrounding the bottom surface;

forming a first wiring layer made of a first metal on the bottom surface and side surfaces of the opening portion surrounding a surface of the insulating resin opposite to the main surface of the substrate, the first wiring layer having a bottom portion formed on the bottom surface of the opening portion and side portions formed on the side surfaces, the bottom portion having a thickness greater than a thickness of at least one of the side portions; and cutting the insulating resin and the first wiring layer such that the insulating resin and the first wiring layer are exposed, wherein the first metal is applied by film deposition to form the first wiring layer, and the thicknesses of the bottom portion and the side portions are adjusted by controlling distribution of incident angles of the first metal.

* * * * *